United States Patent
Darshan et al.

(10) Patent No.: US 8,667,310 B2
(45) Date of Patent: *Mar. 4, 2014

(54) CIRCUIT FOR INDICATING POWER LEVEL OVER A COMMUNICATION INTERFACE

(71) Applicant: Nevermore Solutions LLC, Newport Beach, CA (US)

(72) Inventors: Yair Darshan, Petach Tikva (IL); Eli Ohana, Kfar Sava (IL)

(73) Assignee: Nevermore Solutions LLC, Newport Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/971,285

(22) Filed: Aug. 20, 2013

(65) Prior Publication Data

US 2013/0335230 A1   Dec. 19, 2013

Related U.S. Application Data

(63) Continuation of application No. 12/714,502, filed on Feb. 28, 2010, now Pat. No. 8,539,259, which is a continuation of application No. 11/557,117, filed on Nov. 7, 2006, now Pat. No. 7,681,052.

(60) Provisional application No. 60/735,253, filed on Nov. 10, 2005.

(51) Int. Cl.
   *G06F 1/00*   (2006.01)
(52) U.S. Cl.
   USPC .................................................. 713/300
(58) Field of Classification Search
   USPC .................................................. 713/300
   See application file for complete search history.

(56) References Cited

U.S. PATENT DOCUMENTS

| 5,652,893 | A | 7/1997 | Ben-Meir et al. |
| 5,991,885 | A | 11/1999 | Chang et al. |
| 6,348,874 | B1 | 2/2002 | Cole et al. |
| 6,473,608 | B1 | 10/2002 | Lehr et al. |
| 6,535,983 | B1 | 3/2003 | McCormack et al. |
| 6,643,566 | B1 | 11/2003 | Lehr et al. |
| 2006/0049818 | A1* | 3/2006 | Montgomery ............... 323/364 |
| 2006/0077888 | A1 | 4/2006 | Karam et al. |
| 2006/0092000 | A1 | 5/2006 | Karam et al. |
| 2008/0033602 | A1* | 2/2008 | Dutoya et al. ............... 700/292 |

OTHER PUBLICATIONS

International Preliminary Report on Patentability, WIPO, May 14, 2008, for PCT/IL2006/001282.
Written Opinion, WIPO, May 10, 2008, for PCT/IL2006/001282.

(Continued)

*Primary Examiner* — Mohammed Rehman
(74) *Attorney, Agent, or Firm* — Thomas J. Lavan

(57) ABSTRACT

A circuit is provided. The circuit includes a control circuit, a voltage sensor coupled to the control circuit, and an indicator signal coupled to the control circuit. The control circuit, responsive to the voltage sensor, is configured to detect a first classification voltage within a classification voltage range defined by a lower classification voltage limit and upper classification voltage limit, detect, after detecting the first classification voltage, an indexing voltage outside of the classification voltage range, and detect, after detecting the indexing voltage, a second classification voltage within the classification voltage range. The control circuit is further configured to set the indicator signal to a first predetermined state indicating a power type based on the detected first classification voltage, indexing voltage and second classification voltage.

28 Claims, 7 Drawing Sheets

(56) References Cited

OTHER PUBLICATIONS

Office action for parent US Patent 7,681,052, dated Sep. 4, 2009.
Amendment and response filed Nov. 12, 2009, to Office Action of Sep. 4, 2009.
Office action for patent U.S. Appl. No. 12/714,502, dated Nov. 13, 2012.
Notice of allowance in parent US Patent 7,681,052, dated Jan. 28, 2010.
Notice of allowance in parent U.S. Appl. No. 12/714,502, dated May 21, 2013.

* cited by examiner

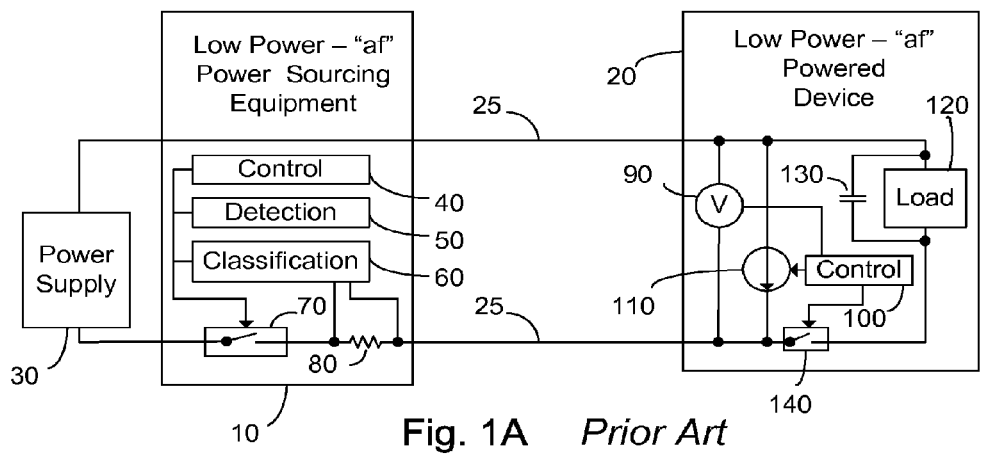
Fig. 1A  *Prior Art*
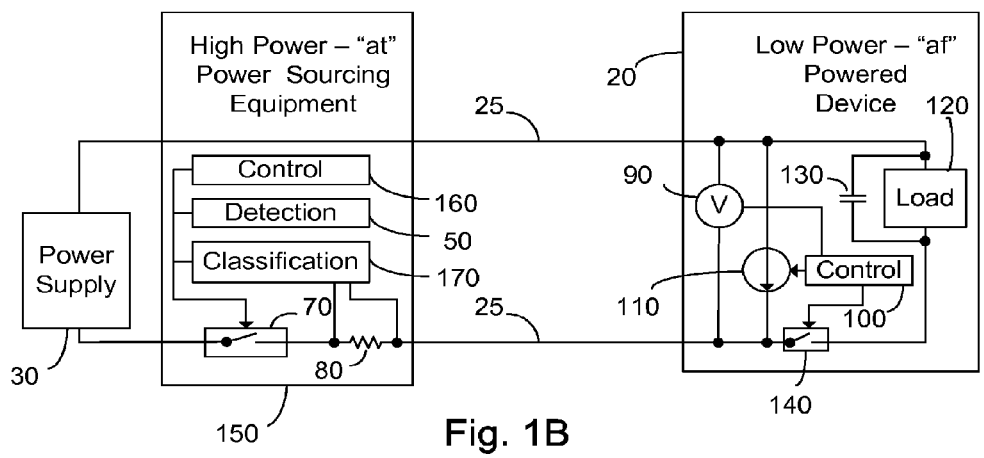
Fig. 1B
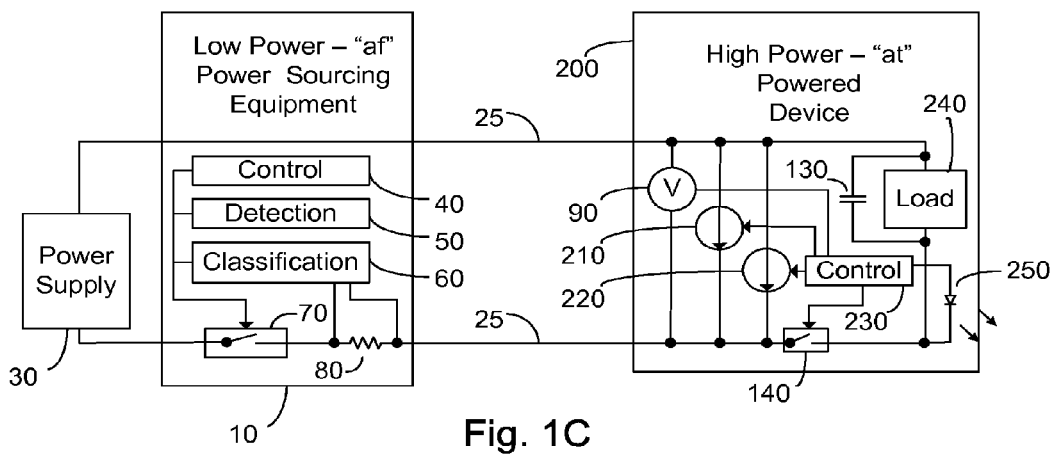
Fig. 1C

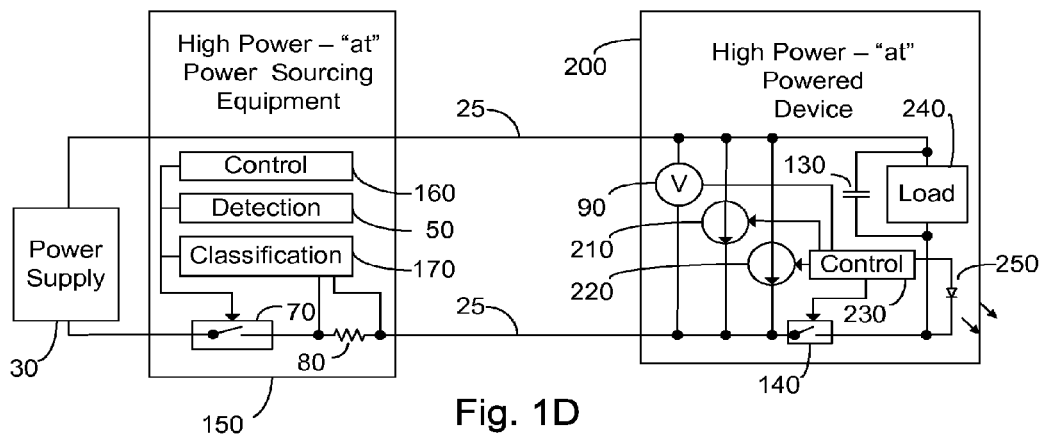
Fig. 1D
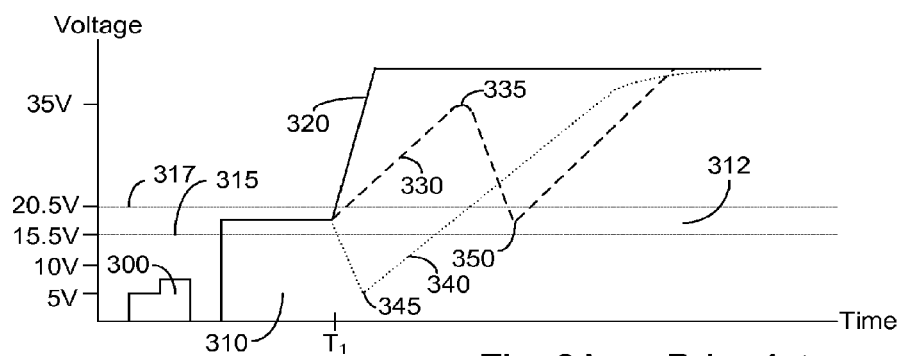
Fig. 2A  *Prior Art*
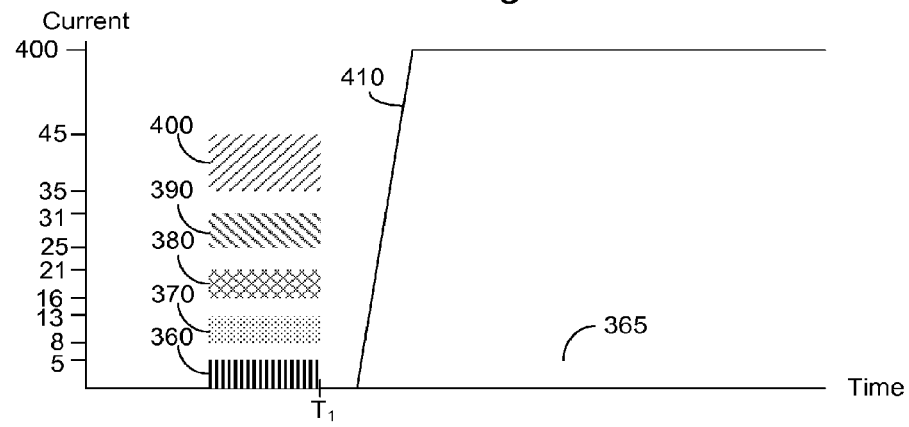
Fig. 2B  *Prior Art*

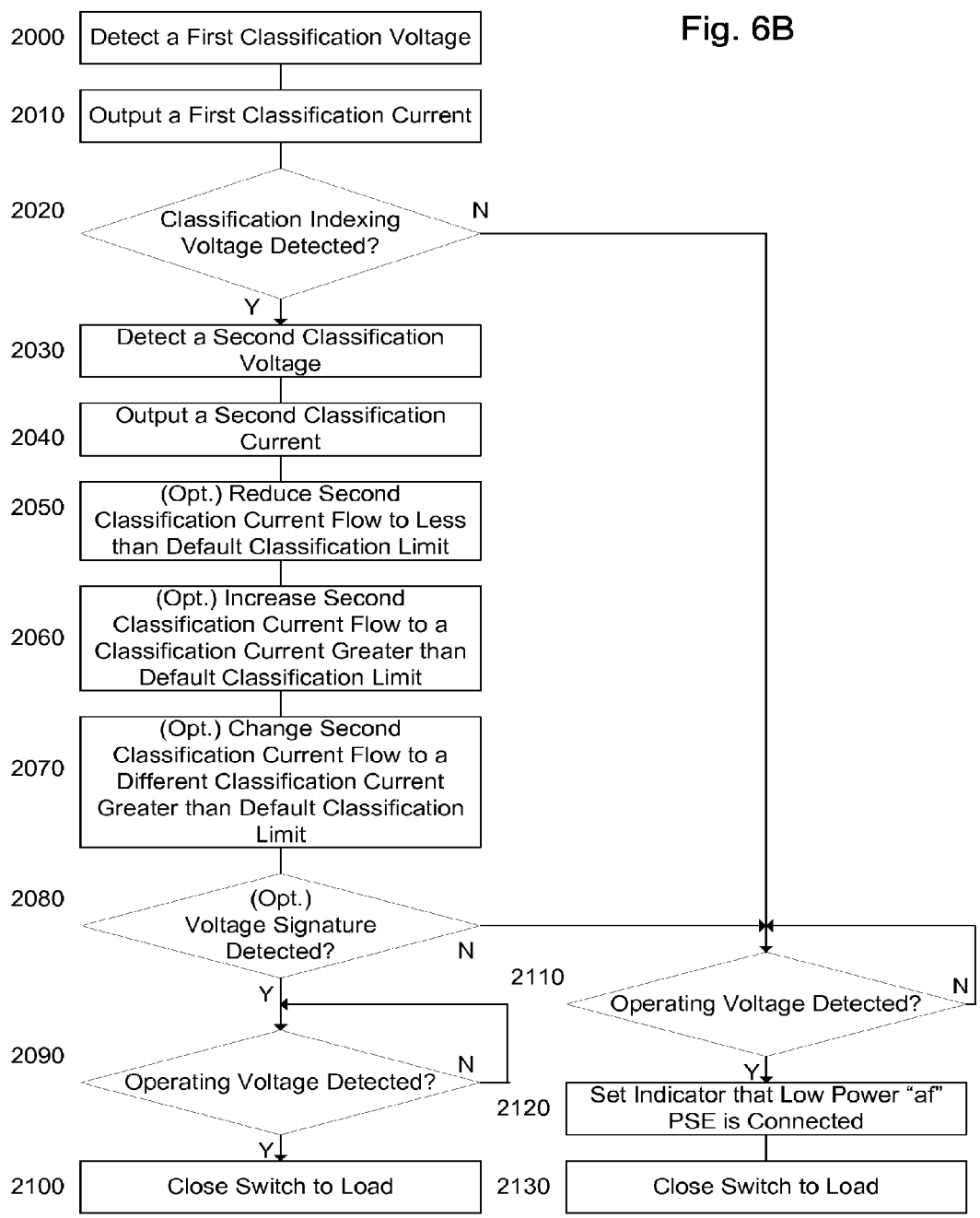

CIRCUIT FOR INDICATING POWER LEVEL OVER A COMMUNICATION INTERFACE

CROSS-REFERENCE TO RELATED APPLICATIONS

This application is a continuation of application Ser. No. 12/714,502 filed Feb. 28, 2010, which is a Continuation of application Ser. No. 11/557,117 filed Nov. 7, 2006, now U.S. Pat. No. 7,681,052, issued Mar. 16, 2010, which claims priority from U.S. Provisional Patent Application Ser. No. 60/735,253 filed Nov. 10, 2005, the contents each of which is herein incorporated by reference.

FIELD

The present invention is directed to classification of power requirements over communication interfaces. In particular, the present invention is directed to circuits and apparatuses for communicating device power requirements over Ethernet interfaces.

BACKGROUND

The present invention relates to the field of power over Ethernet and more particularly to classification of power requirements for high power devices.

The growth of local and wide area networks based on Ethernet technology has been an important driver for cabling offices and homes with structured cabling systems having multiple twisted wire pairs. The ubiquitous local area network, and the equipment which operates thereon, has led to a situation where there is often a need to attach a network operated device for which power is to be advantageously supplied by the network over the network wiring. Supplying power over the network wiring has many advantages including, but not limited to: reduced cost of installation; centralized power and power back-up; and centralized security and management. In the Ethernet technology field, supplying power over an Ethernet interface is referred to as Power over Ethernet (PoE).

Several patents have addressed this issue, including: U.S. Pat. No. 6,473,608 issued to Lehr et al., whose contents are incorporated herein by reference and U.S. Pat. No. 6,643,566 issued to Lehr et al., whose contents are incorporated herein by reference. Furthermore a standard addressed to the issue of powering remote devices over an Ethernet-based network has been published as IEEE 802.3af 2003, whose contents are incorporated herein by reference, and is referred to hereinafter as the "af" standard. A device receiving power over the network wiring is referred to as a powered device (PD) and the powering equipment delivering power into the network wiring for use by the PD is referred to as a power sourcing equipment (PSE).

The "af" standard limits the amount of power available to a powered device to 12.95 watts, and devices demanding power in excess of the 12.95 watt power limit are not supported. In order to meet growing power demands, in particular demands for PDs drawing in excess of 12.95 watts, a task force entitled "IEEE 802.3at DTE Power Enhancements Task Force" was formed, which produced a higher power standard, hereinafter the "at" standard. The "at" standard specified a higher current limit than the "af" standard, and PSEs meeting the "at" standard are required to support PDs meeting the "af" standard. Devices according to the "af" standard are hereinafter alternatively denoted low power devices and devices according to the proposed "at" standard are hereinafter alternatively denoted high power devices. It is to be noted that high power devices may draw less power than an "af" device, however operation is according to the proposed "at" standard for high power devices.

The "at" standard exhibits certain interoperability conditions regarding "af" and "at" equipment. For example, in the event that an "at" PD is connected to an "af" PSE, it is an objective that the "at" PD will notify the user that the power sourcing equipment is of the "af" variety, and thus unable to support full powering under the "at" standards. Similarly, an "at" PSE having an "af" PD attached thereto is expected to identify the PD as being an "af" PD, and further support powering in accordance with the "af" standard. Preferably, such mutual identification is unambiguous, and operates consistently.

In order to improve overall system power and load management, the "af" standard provides for PD classification to one of four potential classes. Each class exhibits a range of maximum power drawn by the PD. Unfortunately, of the four potential classes, class 4 is reserved for future use, and class 0 is defined as a default class in which no power requirement information is supplied by the PD. Thus, effectively only three power requirement classes are provided. The "at" standard is expected to provide additional classes; however, as indicated previously, any classification method must provide for cross compatibility and avoid ambiguity.

SUMMARY

The present invention provides a circuit. The circuit includes a control circuit, a voltage sensor coupled to the control circuit, and an indicator signal coupled to the control circuit. The control circuit, responsive to the voltage sensor, is configured to detect a first classification voltage within a classification voltage range defined by a lower classification voltage limit and upper classification voltage limit, detect, after detecting the first classification voltage, an indexing voltage outside of the classification voltage range, and detect, after detecting the indexing voltage, a second classification voltage within the classification voltage range. The control circuit is further configured to set the indicator signal to a first predetermined state indicating a power type based on the detected first classification voltage, indexing voltage and second classification voltage.

In accordance with another embodiment of the present invention, a circuit is provided. The circuit includes a control circuit, a voltage sensor coupled to the control circuit, a current source coupled to the control circuit, and an indicator signal coupled to the control circuit. The control circuit, responsive to the voltage sensor, is configured to detect a first classification voltage within a classification voltage range defined by a lower classification voltage limit and upper classification voltage limit, generate a first classification current, by the current source, in response to detecting the first classification voltage, and determine if an indexing voltage is detected. The indexing voltage is outside of the classification voltage range. If the indexing voltage is not detected, then set an indicator signal to a low power state based on an operating voltage, and if the indexing voltage is detected, then detect a second classification voltage within the classification voltage range and generate a second classification current, by the current source, in response to detecting the second classification voltage.

In accordance with yet another embodiment of the present invention, an Ethernet device is provided. The Ethernet device includes a control circuit, a voltage sensor coupled to the control circuit, and an indicator signal coupled to the control circuit. The control circuit, responsive to the voltage sensor, is configured to detect a first classification voltage within a classification voltage range defined by a lower classification voltage limit and upper classification voltage limit, detect, after detecting the first classification voltage, an indexing voltage outside of the classification voltage range, and detect, after detecting the indexing voltage, a second classification voltage within the classification voltage range. The control circuit is further configured to set the indicator signal to a first predetermined state indicating a power type based on the detected first classification voltage, indexing voltage and second classification voltage.

In accordance with a further embodiment of the present invention, an Ethernet device is provided. The Ethernet device includes a control circuit, a voltage sensor coupled to the control circuit, a current source coupled to the control circuit, and an indicator signal coupled to the control circuit. The control circuit, responsive to the voltage sensor, is configured to detect a first classification voltage within a classification voltage range defined by a lower classification voltage limit and upper classification voltage limit, generate a first classification current, by the current source, in response to detecting the first classification voltage, and determine if an indexing voltage is detected. The indexing voltage is outside of the classification voltage range. If the indexing voltage is not detected, then set an indicator signal to a low power state based on an operating voltage, and if the indexing voltage is detected, then detect a second classification voltage within the classification voltage range and generate a second classification current, by the current source, in response to detecting the second classification voltage.

Additional features and advantages of embodiments of the present invention will become more readily apparent from the following description, particularly when taken together with the accompanying drawings.

BRIEF DESCRIPTION OF THE DRAWINGS

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

FIG. 1A is a high level schematic diagram of a PoE system comprising a PSE according to the "af" standard and a PD according to the "af" standard according to the conventional art.

FIG. 1B is a high level schematic diagram of a PoE system comprising a PSE according to the proposed "at" standard and a PD according to the "af" standard in accordance with embodiments of the present invention.

FIG. 1C is a high level schematic diagram of a PoE system comprising a PSE according to the "af" standard and a PD according to the proposed "at" standard in accordance with embodiments of the present invention.

FIG. 1D is a high level schematic diagram of a PoE system comprising a PSE according to the proposed "at" standard and a PD according to the proposed "at" standard in accordance with embodiments of the present invention.

FIG. 2A is a chart of the voltage output of the PSE of FIG. 1A exhibiting detection, classification and powering of the PD of FIG. 1A in accordance with the conventional art.

FIG. 2B is a chart of the current draw of the PD from the PSE of FIG. 1A during classification and initial powering, as sensed at the PSE, in accordance with the conventional art.

FIG. 6B is a high level flow chart of the operation of the PD of FIGS. 1C and 1D to respond to classification voltages and determine whether powering is by an "at" or "af" PSE in accordance with embodiments of the present invention.

DETAILED DESCRIPTION

Figure 3A:
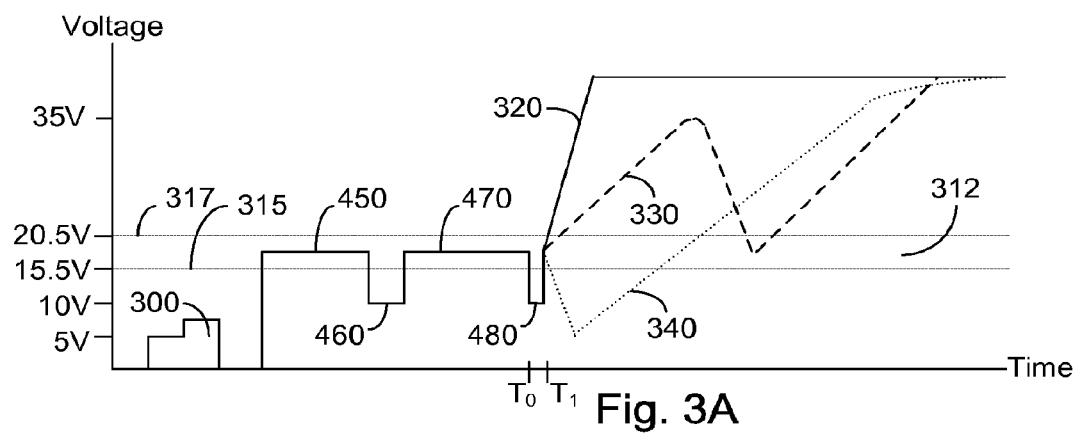
FIG. 3A is a chart of the voltage output of the PSE of FIG. 1B exhibiting detection, classification and powering of the PD of FIG. 1B in accordance with embodiments of the present invention.

The present embodiments enable a classification scheme exhibiting a plurality of classification cycles within the classification voltage range, with the PSE voltage being removed from the classification voltage range between cycles. Preferably, the PD provides a current signature prior to the end of the plurality of cycles by exhibiting a first current output associated with a first class and a second current output associated with a second class. Further preferably the current signature is preceded by a current level not associated with a classification current. Preferably the first and second classes are numerically adjacent classes. Further preferably the first and second classes are consecutively output with no substantial intervening time. Preferably the PSE outputs a voltage signature indicative that it is an "at" PSE, the output voltage signature comprising lowering the output voltage at the end of the plurality of cycles to be less than the classification voltage range.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIG. 1A is a high level schematic diagram of a PoE system according to the conventional art, comprising a PSE 10 according to the "af" standard, a PD 20 according to the "af" standard, a power supply 30, and communication cabling 25. PSE 10 includes control circuitry 40, detection functionality 50, classification functionality 60, an electronically controlled switch 70, and a sense resistor 80. PD 20 includes control circuitry 100, voltage sensor 90, controlled current source 110, load 120, an associated input capacitor 130, and an electronically controlled switch 140. A first output of power supply 30 is connected through PSE 10 to a first end of a first lead of communication cabling 25. The return of power supply 30 is connected to a first end of electronically controlled switch 70 of PSE 10. Control circuitry 40 is in communication with detection functionality 50, classification functionality 60, and the control input of electronically controlled switch 70. The second end of electronically controlled switch 70 is connected to a first end of sense resistor 80 and a second end of sense resistor 80 is connected to a first end of a second lead of communication cabling 25. Classification functionality 60 is connected across sense resistor 80 thus enabling measurement of current flow through sense resistor 80 by measuring the voltage drop across sense resistor 80.

The second end of the first lead of communication cabling 25 is connected at PD 20 to a first end of voltage sensor 90, a first end of load 120, a first end of input capacitor 130, and to a first end of controlled current source 110. The second end of the second lead of communication cabling 25 is connected to the second end of voltage sensor 90, the second end of controlled current source 110, and to a first end of electronically controlled switch 140. The second end of electronically controlled switch 140 is connected to the second end of load 120 and to the second end of input capacitor 130. The output of voltage sensor 90 is connected to an input of control circuitry 100 and the control inputs of controlled current source 110 and electronically controlled switch 140 are connected to respective outputs of control circuitry 100.

In operation, control circuitry 40 operates detection functionality 50 to detect PD 20 via communication cabling 25. Control circuitry 40 further operates classification functionality 60 to classify, in cooperation with current source 110, the detected PD 20 as to power requirements. Classification functionality 60 measures the current flow through sense resistor 80 during the classification phase responsive to controlled current source 110 thereby identifying the power requirements of PD 20 as a function of the measured current flow. Responsive to detection and classification, control circuitry 40 operates electronically controlled switch 70 to connect power supply 30 so as to supply power via communication cabling 25 to identified and classified PD 20.

FIG. 1B is a high level schematic diagram of a PoE system in accordance with embodiments of the present invention comprising a PSE 150 according to the "at" standard, a PD 20 according to the "af" standard, a power supply 30, and communication cabling 25. PSE 150 comprises control circuitry 160, detection functionality 50, classification functionality 170, an electronically controlled switch 70, and a sense resistor 80. PD 20 comprises control circuitry 100, voltage sensor 90, controlled current source 110, load 120, an associated input capacitor 130, and an electronically controlled switch 140. A first output of power supply 30 is connected through PSE 150 to a first end of a first lead of communication cabling 25. The return of power supply 30 is connected to a first end of electronically controlled switch 70 of PSE 150. Control circuitry 160 is in communication with detection functionality 50, classification functionality 170, and the control input of electronically controlled switch 70. The second end of electronically controlled switch 70 is connected to a first end of sense resistor 80 and a second end of sense resistor 80 is connected to a first end of a second lead of communication cabling 25. Classification functionality 170 is connected across sense resistor 80, thus enabling measurement of current flow through sense resistor 80 by measuring the voltage drop across sense resistor 80.

The second end of the first lead of communication cabling 25 is connected at PD 20 to a first end of voltage sensor 90, a first end of load 120, a first end of input capacitor 130, and to a first end of controlled current source 110. The second end of the second lead of communication cabling 25 is connected to the second end of voltage sensor 90, the second end of controlled current source 110, and to a first end of electronically controlled switch 140. The second end of electronically controlled switch 140 is connected to the second end of load 120 and to the second end of input capacitor 130. The output of voltage sensor 90 is connected to an input of control circuitry 100, the control inputs of controlled current source 110, and electronically controlled switch 140 is connected to the respective outputs of control circuitry 100.

In operation, control circuitry 160 operates detection functionality 50 to detect PD 20 via communication cabling 25. Control circuitry 160 further operates classification functionality 170 to classify, in cooperation with controlled current source 110, the detected PD 20 as to power requirements. Classification functionality 170 is further operative, as will be described further hereinto below, to detect that PD 20 is of the low power "af" variety and not a high power "at" device. Classification functionality 170 measures the current flow through sense resistor 80 during the classification phase responsive to controlled current source 110 thereby identifying the power requirements of PD 20 as a function of the measured current flow. Responsive to detection and classification, control circuitry 160 operates electronically controlled switch 70 to connect power supply 30 so as to supply power 20 via communication cabling 25 to identified and classified PD 20.

FIG. 1C is a high level schematic diagram of a PoE system in accordance with a principle of the current invention comprising a PSE 10 according to the "af" standard, a PD 200 according to the "at" standard, a power supply 30, and communication cabling 25. PSE 10 includes control circuitry 40, detection functionality 50, classification functionality 60, an electronically controlled switch 70, and a sense resistor 80. PD 200 comprises control circuitry 230, voltage sensor 90, a first controlled current source 210, a second controlled current source 220, load 240, an associated input capacitor 130, an electronically controlled switch 140, and an indicator 250. A first output of power supply 30 is connected through PSE 10 to a first end of a first lead of communication cabling 25. The return of power supply 30 is connected to a first end of electronically controlled switch 70 of PSE 10. Control circuitry 40 is in communication with detection functionality 50, classification functionality 60, and the control input of electronically controlled switch 70. The second end of electronically controlled switch 70 is connected to a first end of sense resistor 80, and a second end of sense resistor 80 is connected to a first end of a second lead of communication cabling 25. Classification functionality 60 is connected across sense resistor 80, thus enabling measurement of current flow through sense resistor 80 by measuring the voltage drop across sense resistor 80.

The second end of the first lead of communication cabling 25 is connected at PD 200 to a first end of voltage sensor 90, a first end of first controlled current source 210, a first end of second controlled current source 220, a first end of load 240, and to a first end of input capacitor 130. The second end of the second lead of communication cabling 25 is connected to the second end a voltage sensor 90, a second end of first controlled current source 210, a second end of second controlled current source 220, and to a first end of electronically controlled switch 140. The second end of electronically controlled switch 140 is connected to the second end of load 240, the second end of input capacitor 130, and the first end of indicator 250. The output of voltage sensor 90 is connected to an input of control circuitry 230 and the control inputs of first controlled current source 210, second controlled current source 220, and electronically controlled switch 140 is connected to respective outputs of control circuitry 230. The second end of indicator 250 is connected to an output of control circuitry 230. PD 200 is illustrated as including first controlled current source 210 and second controlled current source 220; however this is not meant to be limiting in any way. PD 200 may include a single controlled variable current source operable to output a plurality of current levels responsive to control circuitry 230, or three or more controlled current sources each responsive to control circuitry 230, without exceeding the scope of the invention.

In operation, control circuitry 40 operates detection functionality 50 to detect PD 200 via communication cabling 25. Control circuitry 40 further operates classification functionality 60 to classify, in cooperation with first controlled current source 210, the detected PD 200 as to power requirements. Classification functionality 60 measures the current flow through sense resistor 80 during the classification phase responsive to first controlled current source 210, thereby identifying the power requirements of PD 200 as a function of the measured current flow. It is to be noted that classification functionality 60 is unable to identify PD 200 as a high power "at" device. Responsive to detection and classification, control circuitry 40 operates electronically controlled switch 70 to connect power supply 30 to supply power via communication cabling 25 to identified and classified PD 200.

Control circuitry 230 is operable, as will be described further herein, to detect that PSE 10 is a low power "af" PSE, and in response operate indicator 250 to notify a user of the limited powering capabilities. In one embodiment, control circuitry 230 closes electronically controlled switch 140 to power load 240, and in another embodiment, control circuitry 230 does not power load 240 and indicator 250 is operational to indicate that the failure of load 240 to operate is as a result of a low power "af" source.

FIG. 1D is a high level schematic diagram of a PoE system in accordance with embodiments of the present invention comprising a PSE 150 according to the "at" standard, a PD 200 according to the "at" standard, a power supply 30, and communication cabling 25. PSE 150 includes control circuitry 160, detection functionality 50, classification functionality 170, an electronically controlled switch 70, and a sense resistor 80. PD 200 comprises control circuitry 230, voltage sensor 90, a first controlled current source 210, a second controlled current source 220, load 240, an associated input capacitor 130, an electronically controlled switch 140, and an indicator 250. A first output of power supply 30 is connected through PSE 150 to a first end of a first lead of communication cabling 25. The return of power supply 30 is connected to a first end of electronically controlled switch 70 of PSE 150. Control circuitry 160 is in communication with detection functionality 50, classification functionality 170, and the control input of electronically controlled switch 70. The second end of electronically controlled switch 70 is connected to a first end of sense resistor 80 and a second end of sense resistor 80 is connected to a first end of a second lead of communication cabling 25. Classification functionality 170 is connected across sense resistor 80 thus enabling measurement of current flow through sense resistor 80 by measuring the voltage drop across sense resistor 80.

The second end of the first lead of communication cabling 25 is connected at PD 200 to a first end of voltage sensor 90, a first end of first controlled current source 210, a first end of second controlled current source 220, a first end of load 240, and to a first end of input capacitor 130. The second end of the second lead of communication cabling 25 is connected to the second end of voltage sensor 90, a second end of first controlled current source 210, a second end of second controlled current source 220, and to a first end of electronically controlled switch 140. The second end of electronically controlled switch 140 is connected to the second end of load 240, the second end of input capacitor 130, and the first end of indicator 250. The output of voltage sensor 90 is connected to an input of control circuitry 230 and the control inputs of first controlled current source 210, second controlled current source 220, and electronically controlled switch 140 are connected to respective outputs of control circuitry 230. The second end of indicator 250 is connected to an output of control circuitry 230. PD 200 is illustrated as including first controlled current source 210 and second controlled current source 220; however this is not meant to be limiting in any way. PD 200 may include a single controlled variable current source operable to output a plurality of current levels responsive to control circuitry 230, or three or more controlled current sources responsive to control circuitry 230, without exceeding the scope of the invention.

In operation, control circuitry 160 operates detection functionality 50 to detect PD 200 via communication cabling 25. Control circuitry 160 further operates classification functionality 170 to classify, in cooperation with first controlled current source 210 and second controlled current source 220, the detected PD 200 as to power requirements. Classification functionality 170 measures the current flow through sense resistor 80 during the classification phase responsive to first controlled current source 210 and second controlled current source 220, as will be described further herein below, thereby identifying the power requirements of PD 200 as a function of the measured current flows. It is to be noted that classification functionality 170 is able to identify PD 200 as a high power "at" device. Responsive to detection and classification, control circuitry 160 operates electronically controlled switch 70 to connect power supply 30 to supply power via communication cabling 25 to identified and classified PD 200.

Control circuitry 230 is operable, as will be described further herein below, to detect that PSE 160 is a high power "at" compatible PSE, and thus in response does not operate indicator 250. Control circuitry 230, responsive to a sensed operating voltage, closes electronically controlled switch 140 to supply power to load 240.

FIG. 2A is a chart of the voltage output of PSE 10 exhibiting detection, classification and powering by PSE 10 of PD 20 as depicted in FIG. 1A, in accordance with the conventional art, in which the x-axis represents time and the y-axis represents voltage at the output of PSE 10. A detection waveform 300 is presented by PSE 10 representative of detection and exhibits a plurality of voltage levels operable to detect a valid PD 20 over communication cabling 25. Subsequent to detection waveform 300, and responsive to a successful detection by detection functionality 50 in cooperation with detection waveform 300, a classification waveform 310 is presented by PSE 10. Classification waveform 310 exhibits a voltage level at the output of PSE 10 within a classification voltage range 312 defined between a lower classification voltage limit 315, illustrated as 15.5 volts in accordance with the "af" standard, and an upper classification voltage limit 317, illustrated as 20.5 volts in accordance with the "af" standard, and is operable to classify the detected PD 20 over communication cabling 25. Classification waveform 310 is representative of a classification cycle, and is held within classification voltage range 312 for a period of time sufficient for control circuitry 100 to detect the classification voltage via voltage sensor 90, enable controlled current source 110 to supply a classification current responsive thereto, and for classification functionality 60 to measurably detect the classification current. Such a time period is denoted hereinafter as a classification cycle time. At time $T_1$, PSE 10, having detected and classified PD 20, is operable to increase the output voltage to an operating voltage nominally along curve 320, which is detected by PD 20. PD 20, and in particular control circuitry 100, responsive to the detected increased output voltage as sensed by voltage sensor 90, nominally around 35 V, is operative to close electronically controlled switch 140—thereby connecting load 120 exhibiting input capacitor 130 across power supply 30. Numerous possible actual waveforms may occur, of which waveform 330 and waveform 340 are depicted. Waveform 340 exhibits a voltage decline after point $T_1$, representative of PSE 10 completing the classification function and preparing to close electronically controlled switch 70. Inflection point 345 is representative of the closing of the electronically controlled switch 70. The voltage at the output of PSE 10 then begins to rise until it merges with nominal waveform 320.

Waveform 330 is representative of PSE 10 closing electronically controlled switch 70 after completion of the classification cycle. Inflection point 335 is representative of the closing of electronically controlled switch 140, with a resulting decline in voltage at the output of PSE 10 due to the appearance of input capacitor 130 across the output of PSE 10, which acts as a virtual short circuit. Inflection point 350 represents a minimum voltage point, after which input capacitor 130 is sufficiently charged to allow the output of PSE 10 to rise. It is to be particularly noted that inflection point 350 is within classification voltage range 312, and that inflection point 345 is outside of classification voltage range 312, and particularly below classification voltage range 312.

FIG. 2B is a chart of the current draw of PD 20 during classification and initial powering by PSE 10 of FIG. 1A in accordance with the conventional art, in which the x-axis represents time and the y-axis represents current through PSE 10 as detected by current sense resistor 80. Responsive to classification waveform 310 of FIG. 2A sensed by voltage sensor 90, control circuitry 100 operates controlled current source 110 to output one of four potential classes described in the above mentioned "af" standard. Each of the four classes is represented by differently filled area ending at point $T_1$. Class 0, equivalent to a default classification value, is represented by current under a default classification value limit 365 at area 360. Default classification value limit 365 is depicted as 5 mA in according with the "af" standard, and default classification value limit 365 is representative of a PD not exhibiting a classification functionality such as controlled current source 110. Classes 0, 1, 2, 3 and currently unused class 4, are represented by different current values denoted respectively area 360, area 370, area 380, area 390 and area 400 as illustrated in FIG. 2B each ending at time $T_1$, coincident with, and responsive to, the end of classification waveform 310. Sharply rising current 410 represents the closing of electronically controlled switch 140 by control circuitry 100 responsive to the sensed operating voltage generated after point $T_1$. As described above in relation to FIG. 2A, the sharply rising current representative of input capacitor 130 being placed across PSE 10, may result in a reduced output voltage appearing at PSE 10.

FIG. 3A is a chart of the voltage output of PSE 150 exhibiting detection, classification and powering of PD 20 as depicted in FIG. 1B, in accordance with embodiments of the present invention, in which the x-axis represents time and the y-axis represents voltage at the output of PSE 150. A detection waveform 300 is presented by PSE 10 representative of detection and exhibits a plurality of voltage levels operable to detect a valid PD 20 over communication cabling 25. Subsequent to detection waveform 300, and responsive to a successful detection by detection functionality 50 in cooperation with detection waveform 300, a first classification waveform 450 is presented by PSE 150, exhibiting a voltage level at the output of PSE 150 within a classification voltage range 312 defined between a lower classification voltage limit 315, illustrated as 15.5 volts in accordance with the "af" standard, and an upper classification voltage limit 317, illustrated as 20.5 volts in accordance with the "af" standard, operable to classify the detected PD 20 over communication cabling 25. Waveform 450 is representative of a first classification cycle, and is held within classification voltage range 312 for a period of time sufficient for control circuitry 100 to detect the classification voltage, enable controlled current source 110 to supply the classification current and for classification functionality 170 to measurably detect the classification current, i.e. for a classification cycle time.

Following the completion of the classification cycle time represented by first classification waveform 450, classification indexing waveform 460 is presented, in which the voltage output of PSE 150 is outside of classification voltage range 312. In one embodiment the voltage is above classification voltage range 312, and in another embodiment, as illustrated, the voltage exhibited by classification indexing waveform 460 is below classification voltage range 312. As will be explained further herein below in relation to FIGS. 5A and 5B, the classification indexing waveform 460 is maintained for a classification indexing time sufficient to ensure that voltage at the output has stabilized and been sensed by a control circuitry of an "at" PD, if connected.

Subsequent to the presentation of the classification index waveform 460, second classification waveform 470 is presented by PSE 150, exhibiting a voltage level at the output of PSE 150 within classification voltage range 312. Second classification waveform 470 is representative of a second classification cycle, and is held within classification voltage range 312 for a period of time sufficient for control circuitry 100 to detect the voltage, and if so configured enable controlled current source 110 to supply the classification current, and for classification functionality 170 to measurably detect the classification current, i.e. for a classification cycle time. It is to be understood that PD 20 is not designed to recognize classification indexing waveform 460, nor is it necessarily configured to respond to second classification waveform 470 with an appropriate classification current. Subsequent to second classification waveform 470, preferably voltage signature waveform 480 is presented by PSE 150 starting at time T0. Voltage signature waveform 480, as will be described further hereinto below in relation to FIGS. 5A-6B, is operable to confirm to the attached PD that second classification waveform 470 is as a result of an "at" PSE, such as PSE 150, and is not as a result of noise or a voltage drop due to a sudden current draw as described above in relation to FIG. 2A. Voltage signature waveform 480 exhibits a voltage below that of classification voltage range 312 for a sufficient time period to stabilize and be detected by control circuitry 230.

At time $T_1$, PSE 150, having detected and classified PD 20, is operable to increase the output voltage to an operating voltage nominally along curve 320 which is detected by PD 20. PD 20, and in particular control circuitry 100, responsive to the detected increased output voltage responsive to the detected increased output voltage as sensed by voltage sensor 90, nominally around 35 V, is operative to close electronically controlled switch 140 thereby connecting load 120 exhibiting input capacitor 130 across power supply 30. Numerous possible actual waveforms may occur, of which waveform 330 and waveform 340, as described above in relation to FIG. 2A are depicted.

Figure 3B:
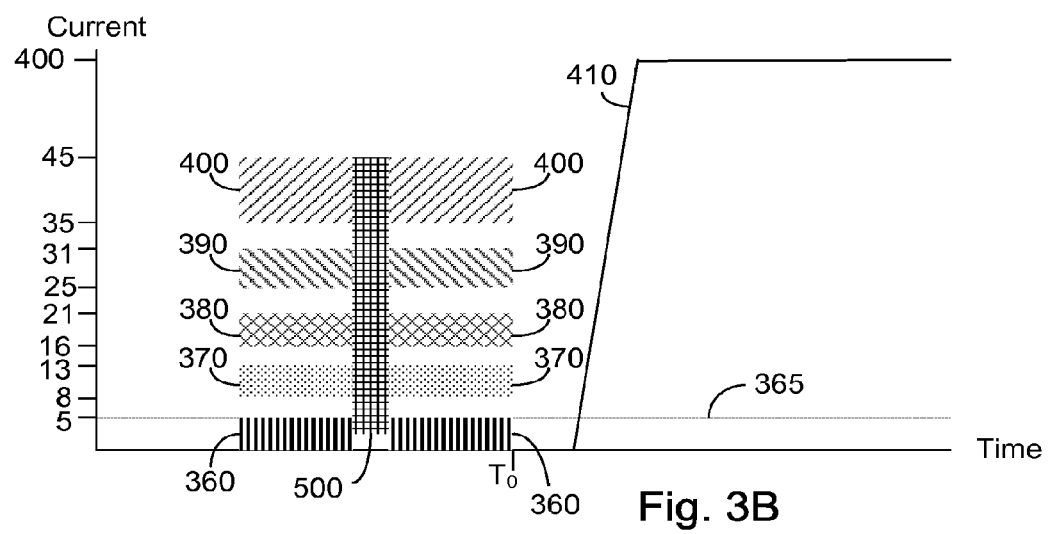
FIG. 3B is a chart of the current draw of the PD from the PSE of FIG. 1B during classification and initial powering by the PSE, as sensed at the PSE, in accordance with embodiments of the present invention.

FIG. 3B is a chart of the current draw of PD 20 during classification and initial powering by PSE 150 of FIG. 1B in accordance with embodiments of the present invention, in which the x-axis represents time and the y-axis represents current through PSE 150 as detected by current sense resistor 80. Responsive to first classification waveform 450 of FIG. 3A sensed by voltage sensor 90, control circuitry 100 operates controlled current source 110 to output one of four potential classes described in the above mentioned "af" standard. Each of the classes is represented by differently filled area ending with the end of first classification waveform 450. Class 0, equivalent to a default classification value, is represented by current under a default classification value limit 365 at area 360. Default classification value limit 365 is depicted as 5 mA in according with the "af" standard, and default classification value limit 365 is representative of a PD not exhibiting a classification current source. Class 0 is thus representative of PD 20 not exhibiting controlled current source 110. Classes 1, 2, 3, and currently unused class 4, are represented by different current values denoted respectively area 370, area 380, area 390 and area 400 as illustrated in FIG. 3B.

Contemporaneously with classification indexing waveform 460, and responsive thereto, a valid classification current is not defined and is illustrated as current level range 500. It is to be understood that the current level may be any value, as an "af" PD such as PD 20 does not have a defined response to classification indexing waveform 460. In one embodiment, PD 20 maintains the classification current, and in another embodiment PD 20 turns off the classification current.

Responsive to second classification waveform 470 of FIG. 3A, in one embodiment as illustrated, control circuitry 100 operates controlled current source 110 to output one of four potential classes described in the above mentioned "af" standard. Each of the classes is represented by a differently filled area ending at point $T_0$ corresponding and responsive to the end of second classification waveform 470. Classes 0, 1, 2, 3, and currently unused class 4, are represented by different current values denoted respectively area 360, area 370, area 380, area 390 and area 400. It is to be understood that there is no requirement under the "af" standard for PD 20 to respond to second classification waveform 470 with a valid classification current, and in another embodiment no classification current is drawn during second classification waveform 470.

Sharply rising current 410 represents the closing of electronically controlled switch 140 by control circuitry 100 responsive to the sensed operating voltage generated after point $T_1$. As described above in relation to FIG. 2A, the sharply rising current representative of input capacitor 130 being placed across PSE 150 may result in a reduced output voltage appearing at PSE 150.

Figure 4A:
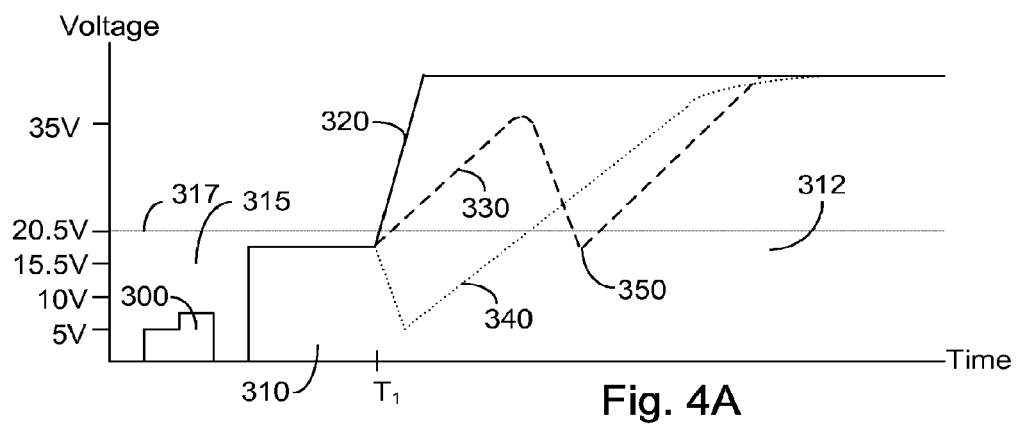
FIG. 4A is a chart of the voltage output of the PSE of FIG. 1C exhibiting detection, classification and powering of the PD of FIG. 1C in accordance with embodiments of the present invention.

FIG. 4A is a chart of the voltage output of PSE 10 of FIG. 1C exhibiting detection, classification and powering of PD 200 of FIG. 1C in accordance with embodiments of the present invention, in which the x-axis represents time and the y-axis represents voltage at the output of PSE 10. A detection waveform 300 is presented by PSE 10 representative of detection and exhibits a plurality of voltage levels operable to detect a valid PD 200 over communication cabling 25. Subsequent to detection waveform 300, and responsive to a successful detection by detection functionality 50 in cooperation with detection waveform 300, a classification waveform 310 is presented by PSE 10. Classification waveform 310 exhibits a voltage level at the output of PSE 10 within a classification voltage range 312 defined between a lower classification voltage limit 315, illustrated as 15.5 volts in accordance with the "af" standard, and an upper classification voltage limit 317, illustrated as 20.5 volts in accordance with the "af" standard, and is operable to classify the detected PD 200 over communication cabling 25. Classification waveform 310 is representative of a classification cycle, and is held within classification voltage range 312 for a period of classification cycle time sufficient for control circuitry 230 to detect the classification voltage, enable first controlled current source 210 to supply the classification current, and for classification functionality 60 to measurably detect the classification current. Classification waveform 310 ends at time $T_1$. At time $T_1$, PSE 10, having detected and classified PD 200, is operable to increase the output voltage to an operating voltage nominally along curve 320 which is detected by PD 200. PD 200, and in particular control circuitry 230, responsive to the detected increased output voltage as sensed by voltage sensor 90, nominally around 35V, is operative to close electronically controlled switch 140 thereby connecting load 240 exhibiting input capacitor 130 across power supply 30. Numerous possible actual waveforms may occur, of which waveform 330 and waveform 340, described above in relation to FIG. 2A are depicted. In particular it is to be noted that waveform 330 exhibits an inflection point within classification voltage range 312, and PD 200 is operable in accordance with a principle of the invention, as will be described further hereinto below, to distinguish that PSE 10 is not a high power "at" PSE.

Figure 4B:
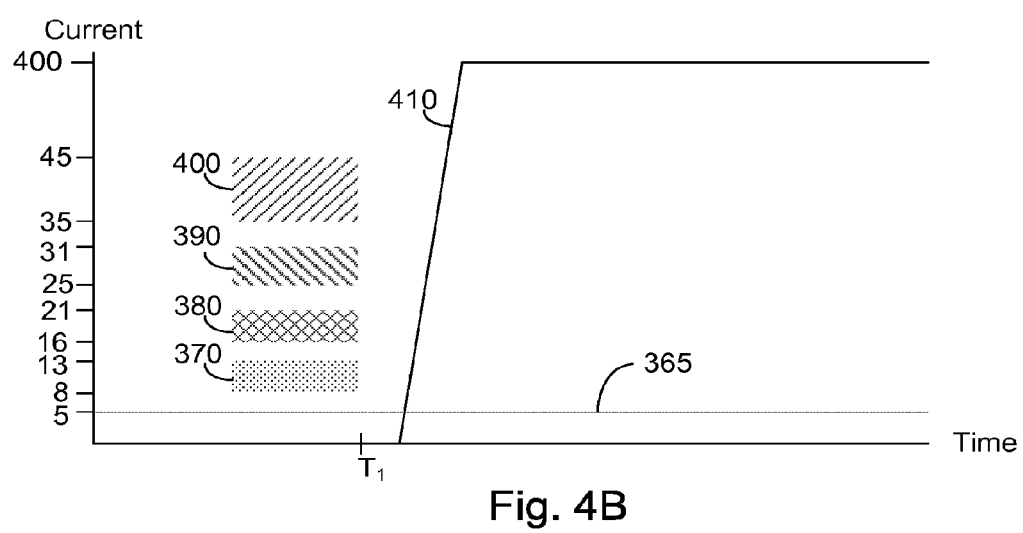
FIG. 4B is a chart of the current draw of the PD of FIG. 1C during classification and initial powering by the PSE, as sensed at the PSE, in accordance with embodiments of the present invention.

FIG. 4B is a chart of the current draw of PD 200 during classification and initial powering by PSE 10 of FIG. 1C in accordance with embodiments of the present invention, in which the x-axis represents time and the y-axis represents current through PSE 10 as detected by current sense resistor 80 and measured by classification functionality 60. Responsive to classification waveform 310 of FIG. 2A sensed by voltage sensor 90, control 230 operates first controlled current source 210 to output one of four potential classes described in the above mentioned "af" standard. Each of the four classes is represented by differently filled area ending at point $T_1$. Class 0 is not presented, as an "at" PD is designed to respond with a classification value in excess of a default classification value limit 365. Default classification value limit 365 is depicted as 5 mA in according with the "af" standard. Classes 1, 2, 3 and currently unused class 4, are represented by different current values denoted respectively area 370, area 380, area 390 and area 400 each ending at time $T_1$. Sharply rising current 410 represents the closing of electronically controlled switch 140 by control circuitry 230 responsive to the sensed operating voltage generated after point $T_1$. As described above in relation to FIG. 2A, the sharply rising current representative of input capacitor 130 being placed across PSE 10, may result in a reduced output voltage appearing at PSE 10.

Figure 5A:
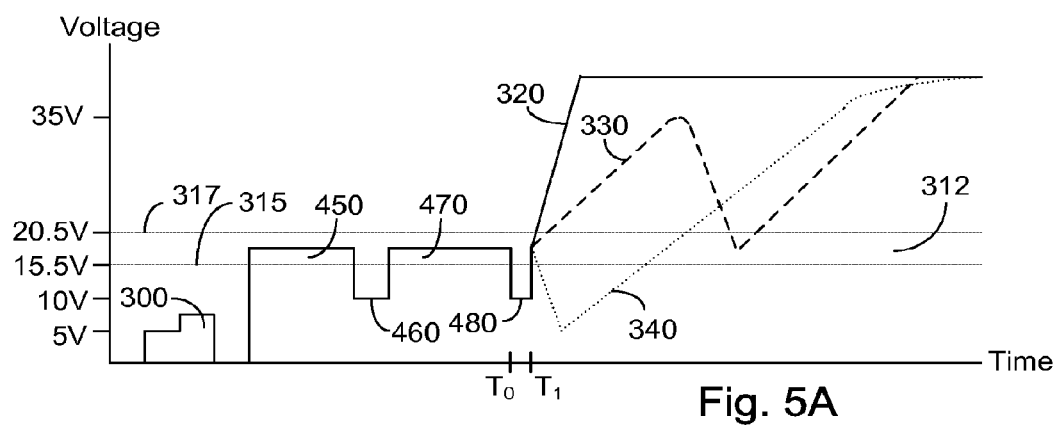
FIG. 5A is a chart of the voltage output of the PSE of FIG. 1D exhibiting detection, classification and powering of the PD of FIG. 1D in accordance with embodiments of the present invention.

FIG. 5A is a chart of the voltage output of PSE 150 exhibiting detection, classification and powering of PD 200 of FIG. 1D in accordance with embodiments of the present invention, in which the x-axis represents time and the y-axis represents voltage at the output of PSE 150. A detection waveform 300 is presented by PSE 150 representative of detection and exhibits a plurality of voltage levels operable to detect a valid PD 200 over communication cabling 25. Subsequent to detection waveform 300, and responsive to a successful detection by detection functionality 50 in cooperation with detection waveform 300, a first classification waveform 450 is presented by PSE 150, exhibiting a voltage level at the output of PSE 150 within a classification voltage range 312 defined between a lower classification voltage limit 315, illustrated as 15.5 volts in accordance with the "af" standard, and an upper classification voltage limit 317, illustrated as 20.5 volts in accordance with the "af" standard, operable to classify the detected PD 200 over communication cabling 25. Waveform 450 is representative of a first classification cycle, and is held within classification voltage range 312 for a period of time sufficient for control circuitry 230 to detect the classification voltage, enable first controlled current source 210 to supply the classification current, and for classification functionality 170 to measurably detect the classification current, i.e. for a classification cycle time.

Following the completion of the classification cycle time represented by first classification waveform 450, classification indexing waveform 460 is presented, in which the voltage output of PSE 150 is outside of classification voltage range 312. In one embodiment the voltage is above classification voltage range 312, and in another embodiment, as illustrated, the voltage exhibited by classification indexing waveform 460 is below classification voltage range 312. Classification indexing waveform 460 is maintained for a classification indexing time sufficient to ensure that voltage at the output has stabilized and been sensed by control circuitry 230. Control circuitry 230 is operative to index the classification output to enable second controlled current source 220 in the event that a second classification voltage waveform is detected.

Subsequent to the presentation of the classification index waveform 460, second classification waveform 470 is presented by PSE 150, exhibiting a voltage level at the output of PSE 150 within classification voltage range 312. Second classification waveform 470 is representative of a second classification cycle, and is held within classification voltage range 312 for a period of time sufficient for control circuitry 230 to detect the voltage, and as described above to supply a classification current from second controlled current source 220, and for classification functionality 170 to measurably detect the classification current, i.e. for a classification cycle time. Second classification waveform 470 ends at time $T_0$.

In an optional embodiment, control 230 is further operable to output a current signature, as will be described further hereinto below in relation to FIG. 5B, confirming to PSE 150 that the second classification current is a consequence of second controlled current source 220, and not a result of noise or an "af" PD exhibiting a second undefined current responsive to classification indexing waveform 460 and second classification waveform 470.

Subsequent to second classification waveform 470, preferably voltage signature waveform 480 is presented by PSE 150 starting at time $T_0$. Voltage signature waveform 480, is operable to confirm to PD 200 that second classification waveform 470 is as a result of an "at" PSE, such as PSE 150, and is not as a result of noise or a voltage drop due to a sudden current draw as described above in relation to FIG. 2A. Voltage signature waveform 480 exhibits a voltage below that of classification voltage range 312 for a sufficient time period to stabilize and be detected by control circuitry 230.

At time $T_1$, PSE 150, having detected and classified PD 200, is operable to increase the output voltage to an operating voltage nominally along curve 320 which is detected by PD 200. PD 200, and in particular control circuitry 230, responsive to the detected increased output voltage as sensed by voltage sensor 90, nominally around 35V, is operative to close electronically controlled switch 140, thereby connecting load 240 exhibiting input capacitor 130 across power supply 30. Numerous possible actual waveforms may occur, of which waveform 330 and waveform 340, as described above in relation to FIG. 2A are depicted.

Figure 5B:
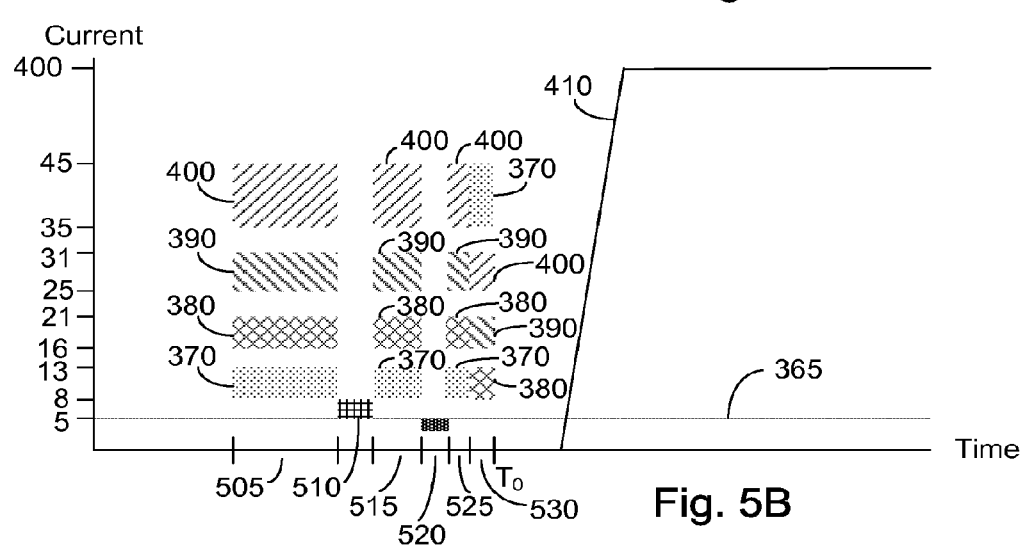
FIG. 5B is a chart of the current draw of the PD of FIG. 1D during classification and initial powering by the PSE, as sensed by the PSE, in accordance with embodiments of the present invention.

FIG. 5B is a chart of the current draw of PD 200 during classification and initial powering by PSE 150 of FIG. 1D in accordance with embodiments of the present invention, in which the x-axis represents time and the y-axis represents current through PSE 150 as detected by current sense resistor 80. Responsive to first classification waveform 450 of FIG. 5A sensed by voltage sensor 90, control 230 operates first controlled current source 210 to output one of 4 potential classes described in the above mentioned "af standard. Each of the classes is represented by differently filled area ending responsive to the end of first classification waveform 450 and exhibits a current above a default classification value limit 365. Each of the respective classification currents are output for a time period 505 approximately contemporaneous with, and responsive to, first classification waveform 450. Default classification value limit 365 is depicted as 5 mA in according with the "af standard. Classes 1, 2, 3 and currently unused class 4, are represented by different current values denoted respectively area 370, area 380, area 390 and area 400.

Responsive to classification indexing waveform 460 sensed by voltage sensor 90, draw down current 510, illustrated as a range below class 1, is drawn by PD 200 so as to ensure that classification indexing waveform 460 is stabilized within the desired range. Draw down current 510 is illustrated as being below class 1 and above default classification value limit 365, however this is not meant to be limiting in any way. Draw down current 510 may be any value sufficient to ensure stabilization of classification indexing waveform 460. In one embodiment draw down current 510 is drawn by an additional controlled current source (not shown). In another embodiment, in which a variable controlled current source is utilized, the variable controlled current source is set an appropriate draw down value sufficient to ensure voltage stabilization and discharge any capacitance to drawn down the output voltage of PSE 150 to define classification indexing waveform 460.

Responsive to second classification waveform 470 of FIG. 5A, control circuitry 230 operates second controlled current source 220 to output one of 4 potential classes described in the above mentioned "af" standard. Each of the classes is represented by differently filled area ending at point $T_0$. Classes 1, 2, 3 and currently unused class 4, are represented by different current values denoted respectively area 370, area 380, area 390 and area 400 as illustrated in FIG. 3B and are output for a time period 515. It is to be understood that there is no requirement that first and second controlled current source 210, 220 output the same or different values. Various combinations may be utilized to produce a plurality of classification codes comprising one or more classification values.

Time period 515 is sufficient to stabilize the current flow from the output of second controlled current source 220, and sufficient to enable classification functionality 170 to measurably obtain the value of the stabilized current flow through sense resistor 80. Preferably, subsequent to time period 515, control circuitry 230 disables second current source 220 for a time period depicted as period 520. Minimal current flow, if any, occurs during time period 520 which is of a sufficient duration to allow for stabilization of the minimal current flow, and sufficient to enable classification functionality 170 to measurably obtain the value of the minimal current flow through sense resistor 80. The minimal current flow of time period 520 is depicted as a range of values less than default classification value limit 365.

Subsequent to time period 520, preferably control circuitry 230 operates second controlled current source 220 to output the class output during time period 515 for an additional time period 525. Each of the classes is represented by differently filled areas, and classes 1, 2, 3 and currently unused class 4, are represented by different current values denoted respectively area 370, area 380, area 390 and area 400. The above has been described in which the same class is output during period 515 and 525 however this is not meant to be limiting in any way. In another embodiment the class output during time period 525 is different from the class output during time period 515 without exceeding the scope of the invention. Time period 525 is sufficient to stabilize the current flow from the output of second controlled current source 220, and sufficient to enable classification functionality 170 to measurably obtain the value of the stabilized current flow through sense resistor 80.

Subsequent to time period 525, preferably control circuitry 230 operates one of first and second controlled current sources 210, 220, or in an embodiment in which a variable controlled current source is utilized control circuitry 230 sent the variable controlled current source, to output a class different from the class output during time period 525 for an additional time period 530, ending with time $T_0$. In one embodiment a class adjacent to the class output in time period 525 is utilized during time period 530, and in another embodiment the class output in time period 505 is utilized. Each of the classes is represented by differently filled area, with the adjacent classes to classes 1, 2, 3 and currently unused class 4, represented by the same markings as the original classes respectively area 370, area 380, area 390 and area 400. The above has been described in which the adjacent class is output during period 530; however this is not meant to be limiting in any way. Time period 530 is sufficient to stabilize the current flow from the output of second controlled current source 220, and sufficient to enable classification functionality 170 to measurably obtain the value of the stabilized current flow through sense resistor 80.

Time period 530 ends at time $T_0$. Sharply rising current 410 represents the closing of electronically controlled switch 140 by control circuitry 100 responsive to the sensed operating voltage generated after point $T_1$. As described above in relation to FIG. 2A, the sharply rising current representative of input capacitor 130 being placed across PSE 10, may result in a reduced output voltage appearing at PSE 10.

The above has been described in relation to an embodiment in which the power over Ethernet (PoE) controller presents a first classification cycle, a classification indexing, and a second classification cycle, however this is not meant to be limiting in any way. Three or more classification cycles each separated by a classification indexing may be provided without exceeding the scope of the invention.

Figure 6A:
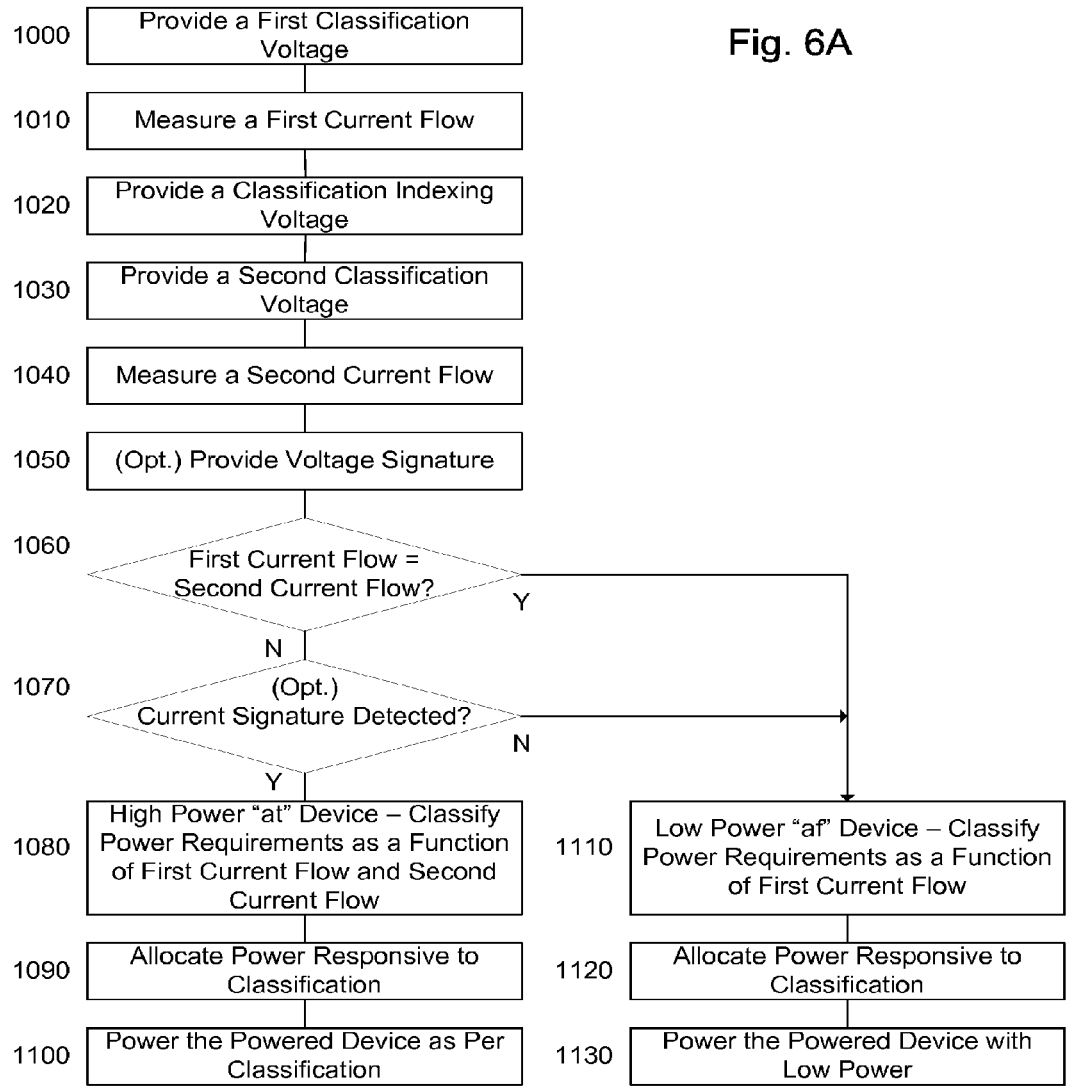
FIG. 6A is a high level flow chart of the operation of the PSE of FIGS. 1B and 1D to classify the attached detected PD in accordance with embodiments of the present invention.

FIG. 6A is a high level flow chart of the operation of PSE 150 of FIGS. 1B and 1D to classify the attached detected PD 20, 200 respectively, in accordance with embodiments of the present invention. In stage 1000, a first classification voltage is provided by PSE 150. In stage 1010 a current flow responsive to the first classification voltage of stage 1000 is measured by classification functionality 170. In stage 1020 a classification indexing voltage is provided by PSE 150. The classification indexing voltage is out of the classification voltage range defined by a lower classification voltage limit and an upper classification voltage limit. The classification indexing voltage is presented for a sufficient time for the voltage to stabilize and for the attached PD to recognize the classification indexing if so configured.

In stage 1030, a second classification indexing voltage is provided by PSE 150. In stage 1040 a current flow responsive to the second classification voltage of stage 1030 is measured by classification functionality 170. In stage 1050, PSE 150 optionally supplies a voltage signature as described in relation to voltage signature 480 of FIG. 5A.

In stage 1060, the first current flow measured in stage 1010 and the second current flow measured in stage 1040 are compared. In the event that the current flows are substantially equal, in stage 1110 the PD is determined to be a low power "af" device, i.e. PD 20 of FIG. 1B. In response to the determination, PSE 150 classifies the power requirements as a function of the first current flow. In stage 1120, power is allocated to the determined PD 20 responsive to the classification of stage 1110. In stage 1130, PSE 150 allocates power and powers the determined and classified PD 20 with low power in accordance with the "af" standard.

In the event that in stage 1060 the first current flow and second current flow are not substantially equal, in stage 1070 optionally detection of a current signature as described in relation to FIG. 5B, and in particular time periods 520 and 525, and optionally time period 530, is examined. The operation of stage 1070 is optional in that it is a second check to ensure accurate determination between a low power "af" PD and a high power "at" PD.

In the event that in optional stage 1070 the current signature is not detected, stage 1110 as described above is performed. In the event that in stage 1070 the current signature is detected, in stage 1080 the PD is determined to be a high power "at" device, such as PD 200 of FIG. 1D. In response to the determination, PSE 150 classifies the power requirements as a function of a combination of the first current flow measured in stage 1010 and of the second current flow measured in stage 1040. In stage 1090, power is allocated to the determined PD 200 responsive to the classification of stage 1070. In stage 1100, PSE 150 allocates power and powers the determined and classified PD 200 in accordance with the "at" powering requirements.

Thus, the operation of FIG. 6A determines whether the attached PD is a low power "af" PD such as PD 20 or a high power "at" PD such as PD 200. Furthermore, the operation of FIG. 6A preferably confirms to PD 200 that it is connected to an "at" PSE.

FIG. 6B is a high level flow chart of the operation of PD 200 of FIGS. 1C and 1D to respond to classification voltages and determine whether powering is by an "at" PSE, such as PSE 150 of FIG. 1D, or an "af" PSE, such as PSE 10 of FIG. 1C, in accordance with embodiments of the present invention. In stage 2000, control 230 detects a first classification voltage output by either PSE 10 or PSE 150. In stage 2010, responsive to the detected first classification voltage of stage 2000, control 230 operates first controlled current source 210 to output a first classification current at a predetermined level.

In stage 2020, control circuitry 230 monitors voltage sensor 90 to detect a first classification indexing voltage output by PSE 150 such as classification indexing waveform 460 of FIG. 5A. In the event that classification indexing waveform 460 is detected, in stage 2030 a second classification voltage output by PSE 150 is detected by monitoring the output of voltage sensor 90. In stage 2040, responsive to the detected second classification voltage of stage 2030, control circuitry 230 operates second controlled current source 220 to output a second classification current at a predetermined level. In one embodiment first classification current output by first controlled current source 210 is of a different value than the second classification current output by second controlled current source 220; however this is not meant to be limiting in any way. First classification current output by first controlled current source 210 may be of the same value as the second classification current output by second controlled current source 220 without exceeding the scope of the invention.

In stage 2050, optionally, second classification current flow output by second controlled current source 220 is reduced to a value less than the default classification value limit 365. Preferably, the optional reduction of the current flow value occurs after a sufficient time for the current flow to have stabilized and be measurably detected by detection functionality 170. In stage 2060, optionally, second classification current flow output by second controlled current source 220 is increased to a classification current greater than default classification value limit 365. In one embodiment, the current flow output of stage 2060 is of the same value as the current flow output of stage 2040; however this is not meant to be limiting in any way. The current flow output of stage 2060 may be greater than or less than the value of the current flow output of stage 2040, provided that it is greater than default classification value limit 365, without exceeding the scope of the invention. Preferably, the current flow output of stage 2060 represents a valid classification value. The current flow output of stage 2060 is maintained for a period of time sufficient for the current flow to stabilize and to be measurably detected and sampled by classification functionality 170. In stage 2070, optionally, the value of the current flow output of stage 2060 is changed to a different value greater than default classification value limit 365. In one embodiment, the current flow output of stage 2070 represents an adjacent valid classification value to the classification value of stage 2060. For example, in the event that the output of stage 2060 was representative of class 3, the output of stage 2070 representative of class 2. In the event that the output of stage 2060 is representative of class 1, preferably the output of stage 2070 represents class 4, thus representing adjacency in a circular manner through the active classes.

Stages 2050 through 2070 are optional, as the current signature represents a second confirmation that PD 200 is an "at" PD. Any or all of stages 2050 through 2070 may be optionally implemented without exceeding the scope of the invention. In particular stages 2050 and 2060 may be implemented without stage 2070 without exceeding the scope of the invention.

In stage 2080, optionally a voltage signature output by PSE 150, such as voltage signature waveform 480 of FIG. 5A, is detected by monitoring voltage sensor 90. Stage 2080 is optional in that it represents a further confirmation that the PSE is of the "at" high power type. In the event that the voltage signature is detected, in stage 2090 voltage sensor 90 is monitored until an operating voltage level is detected. In the event that an operating voltage is not detected, stage 2090 is repeated. In the event that an operating voltage is detected, in stage 2100 control 230 closes electronically controlled switch 140 to power load 240.

In the event that in stage 2020 the classification indexing voltage was not detected, or in the event that in optional stage 2080 the voltage signature was not detected, in stage 2110 voltage sensor 90 is monitored until an operating voltage level is detected. In the event that an operating voltage is not detected, stage 2110 is repeated. In the event that in stage 2110 an operating voltage is detected, in stage 2120 indicator 250 is set to indicate that low power "af" PSE 10 is connected. In stage 2130 control circuitry 230 closes electronically controlled switch 140 to power load 240 with reduced power.

The above has been described in an embodiment in which an "at" PD, such as PD 200, powers load 240 with low power from an "af" PSE, such as PSE 10. This is not meant to be limiting in any way and in another embodiment control circuitry 230 sets indicator 250 to indicate that a low power "af" PSE, such as PSE 10, is connected and stage 2130 is not performed. In such an embodiment indicator 250 indicates that PD 200 is not defective, but is instead connected to an improper power source.

The method of FIG. 6B thus enables PD 200 to identify the powering source, be it an "af" PSE, such as PSE 10 of FIG. 1C, or an "at" PSE, such as PSE 150 of FIG. 1D.

Thus, the present embodiments enable a classification scheme exhibiting a plurality of classification cycles within the classification voltage range, with the PSE voltage being removed from the classification voltage range between cycles. Preferably, the PD provides a current signature prior to the end of the plurality of cycles by exhibiting a first current output associated with a first class and a second current output associated with a second class. Further preferably the current signature is preceded by a current level not associated with a classification current. Preferably the first and second classes are numerically adjacent classes. Further preferably the first and second classes are consecutively output with no substantial intervening time. Preferably the PSE outputs a voltage signature indicative that it is an "at" PSE, the output voltage signature comprising lowering the output voltage at the end of the plurality of cycles to be less than the classification voltage range.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable subcombination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described herein. Rather, the scope of the present invention is defined by the appended claims and includes both combinations and subcombinations of the various features described herein as well as variations and modifications thereof which would occur to persons skilled in the art upon reading the foregoing description and which are not in the prior art.

We claim:
1. A circuit, comprising:
a control circuit;
a voltage sensor coupled to the control circuit; and
an indicator signal coupled to the control circuit,
wherein the control circuit, responsive to the voltage sensor, is configured to:
detect a first classification voltage within a classification voltage range defined by a lower classification voltage limit and upper classification voltage limit;

detect, after detecting the first classification voltage, an indexing voltage outside of the classification voltage range; and detect, after detecting the indexing voltage, a second classification voltage within the classification voltage range, wherein the control circuit is further configured to set the indicator signal to a first predetermined state indicating a power type based on the detected first classification voltage, indexing voltage and second classification voltage.

2. The circuit of claim 1, wherein after the control circuit detects the second classification voltage, the control circuit is further configured to:

detect a signature voltage below the classification voltage range and set the indicator signal to the first predetermined state in response to the detected signature voltage.

3. The circuit of claim 2, wherein in the event that the control circuit does not detect the signature voltage, the control circuit is further configured to:

set the indicator signal to a second predetermined state indicating a low power type.

4. The circuit of claim 1, wherein in the event that the control circuit detects the first classification voltage and does not detect the indexing voltage, the control circuit is further configured to:

set the indicator signal to a second predetermined state indicating a low power type.

5. The circuit of claim 1, further comprising:

at least one current source coupled to the control circuit, wherein the control circuit is configured to control the at least one current source to provide a first predetermined classification current responsive to the detected first classification voltage and a second predetermined classification current responsive to the detected second classification voltage.

6. The circuit of claim 1, further comprising:

at least one current source responsive to the control circuitry, wherein the control circuitry is configured to control the at least one current source to:

provide a first predetermined classification current responsive to the detected first classification voltage, wherein the first predetermined classification current exceeds a default classification value limit;

provide a draw down current responsive to the detected indexing voltage; and provide a second predetermined classification current exceeding a default classification value limit responsive to the detected second classification voltage.

7. The circuit of claim 6, wherein the draw down current is of a value greater than the default classification value limit.

8. A circuit, comprising:
a control circuit;
a voltage sensor coupled to the control circuit;
a current source coupled to the control circuit; and
an indicator signal coupled to the control circuit,
wherein the control circuit, responsive to the voltage sensor, is configured to:
detect a first classification voltage within a classification voltage range defined by a lower classification voltage limit and upper classification voltage limit;
generate a first classification current, by the current source, in response to detecting the first classification voltage;
determine if an indexing voltage is detected, wherein the indexing voltage is outside of the classification voltage range;

if the indexing voltage is not detected, then set an indicator signal to a low power state based on an operating voltage; and
if the indexing voltage is detected, then:
detect a second classification voltage within the classification voltage range, and
generate a second classification current, by the current source, in response to detecting the second classification voltage.

9. The circuit of claim 8, wherein after the control circuit is configured to generate the second classification current by the current source, the control circuit is further configured to:

change the second classification current, by the current source, to a different current than a default classification limit.

10. The circuit of claim 9, wherein after the control circuit is configured to change the second classification current by the current source, the control circuit is further configured to:

detect a signature voltage, wherein:
if the signature voltage is not detected, then set an indicator signal to a low power state based on an operating voltage; and
if the signature voltage is detected, then wait for an operating voltage to be detected.

11. The circuit of claim 10, wherein the control circuit is further configured to set the indicator signal to the low power state based on the operating voltage comprises the control circuit is configured to:

wait for the voltage sensor to detect the operating voltage; and
set the indicator signal to the state indicating the low power state.

12. The circuit of claim 11, wherein the control circuit is configured to closing a switch to a load after one of the control circuit is configured to detect the operating voltage and the control circuit is configured to set the indicator signal to the low power state based on the operating voltage.

13. The circuit of claim 12, further comprising:
at least one current source coupled to the control circuit, wherein the control circuit is configured to control the at least one current source to provide a first predetermined classification current responsive to the detected first classification voltage and a second predetermined classification current responsive to the detected second classification voltage.

14. The circuit of claim 1, wherein the first predetermined state indicates a high power type.

15. An Ethernet device, comprising:
a control circuit;
a voltage sensor coupled to the control circuit; and
an indicator signal coupled to the control circuit,
wherein the control circuit, responsive to the voltage sensor, is configured to:
detect a first classification voltage within a classification voltage range defined by a lower classification voltage limit and upper classification voltage limit;
detect, after detecting the first classification voltage, an indexing voltage outside of the classification voltage range; and
detect, after detecting the indexing voltage, a second classification voltage within the classification voltage range, wherein the control circuit is further configured to set the indicator signal to a first predetermined state indicating a power type based on the detected first classification voltage, indexing voltage and second classification voltage.

16. The Ethernet device of claim 15, wherein after the control circuit detects the second classification voltage, the control circuit is further configured to:
detect a signature voltage below the classification voltage range and set the indicator signal to the first predetermined state in response to the detected signature voltage.

17. The Ethernet device of claim 16, wherein in the event that the control circuit does not detect the signature voltage, the control circuit is further configured to:
set the indicator signal to a second predetermined state indicating a low power type.

18. The Ethernet device of claim 15, wherein in the event that the control circuit detects the first classification voltage and does not detect the indexing voltage, the control circuit is further configured to:
set the indicator signal to a second predetermined state indicating a low power type.

19. The Ethernet device of claim 15, further comprising:
at least one current source coupled to the control circuit, wherein the control circuit is configured to control the at least one current source to provide a first predetermined classification current responsive to the detected first classification voltage and a second predetermined classification current responsive to the detected second classification voltage.

20. The Ethernet device of claim 15, further comprising:
at least one current source responsive to the control circuitry, wherein the control circuitry is configured to control the at least one current source to:
provide a first predetermined classification current responsive to the detected first classification voltage, wherein the first predetermined classification current exceeds a default classification value limit;
provide a draw down current responsive to the detected indexing voltage; and
provide a second predetermined classification current exceeding a default classification value limit responsive to the detected second classification voltage.

21. The Ethernet device of claim 20, wherein the draw down current is of a value greater than the default classification value limit.

22. An Ethernet device, comprising:
a control circuit;
a voltage sensor coupled to the control circuit;
a current source coupled to the control circuit; and
an indicator signal coupled to the control circuit,
wherein the control circuit, responsive to the voltage sensor, is configured to:
detect a first classification voltage within a classification voltage range defined by a lower classification voltage limit and upper classification voltage limit;
generate a first classification current, by the current source, in response to detecting the first classification voltage;
determine if an indexing voltage is detected, wherein the indexing voltage is outside of the classification voltage range;
if the indexing voltage is not detected, then set an indicator signal to a low power state based on an operating voltage; and
if the indexing voltage is detected, then:
detect a second classification voltage within the classification voltage range, and
generate a second classification current, by the current source, in response to detecting the second classification voltage.

23. The Ethernet device of claim 22, wherein after the control circuit is configured to generate the second classification current by the current source, the control circuit is further configured to:
change the second classification current, by the current source, to a different current than a default classification limit.

24. The Ethernet device of claim 23, wherein after the control circuit is configured to change the second classification current by the current source, the control circuit is further configured to:
detect a signature voltage, wherein:
if the signature voltage is not detected, then set an indicator signal to a low power state based on an operating voltage; and
if the signature voltage is detected, then wait for an operating voltage to be detected.

25. The Ethernet device of claim 24, wherein the control circuit is further configured to set the indicator signal to the low power state based on the operating voltage comprises the control circuit is configured to:
wait for the voltage sensor to detect the operating voltage; and
set the indicator signal to the state indicating the low power state.

26. The Ethernet device of claim 25, wherein the control circuit is configured to closing a switch to a load after one of the control circuit is configured to detect the operating voltage and the control circuit is configured to set the indicator signal to the low power state based on the operating voltage.

27. The Ethernet device of claim 26, further comprising:
at least one current source coupled to the control circuit, wherein the control circuit is configured to control the at least one current source to provide a first predetermined classification current responsive to the detected first classification voltage and a second predetermined classification current responsive to the detected second classification voltage.

28. The Ethernet device of claim 15, wherein the first predetermined state indicates a high power type.

* * * * *